United States Patent
Mulfinger et al.

(10) Patent No.: US 8,183,100 B2
(45) Date of Patent: May 22, 2012

(54) TRANSISTOR WITH EMBEDDED SI/GE MATERIAL HAVING ENHANCED ACROSS-SUBSTRATE UNIFORMITY

(75) Inventors: Robert Mulfinger, Dresden (DE); Andy Wei, Dresden (DE); Jan Hoentschel, Dresden (DE); Casey Scott, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 214 days.

(21) Appl. No.: 12/562,437

(22) Filed: Sep. 18, 2009

(65) Prior Publication Data

US 2010/0078691 A1 Apr. 1, 2010

(30) Foreign Application Priority Data

Sep. 30, 2008 (DE) .......................... 10 2008 049 723

(51) Int. Cl.
*H01L 21/84* (2006.01)
(52) U.S. Cl. .................. 438/154; 257/E21.561; 438/300
(58) Field of Classification Search .......... 438/151–166; 257/E21.561
See application file for complete search history.

(56) References Cited

U.S. PATENT DOCUMENTS

| | | | | |
|---|---|---|---|---|
| 5,414,276 A | * | 5/1995 | McCarthy | 257/57 |
| 5,716,218 A | * | 2/1998 | Farnworth et al. | 438/15 |
| 2008/0135894 A1 | | 6/2008 | Bohr et al. | 257/288 |

OTHER PUBLICATIONS

Translation of Official Communication from German Patent Office for German Patent Application No. 10 2008 049 723.1 dated Sep. 17, 2009.

* cited by examiner

*Primary Examiner* — Richard A. Booth
(74) *Attorney, Agent, or Firm* — Williams, Morgan & Amerson

(57) ABSTRACT

In sophisticated semiconductor devices, a strain-inducing semiconductor alloy may be positioned close to the channel region by forming cavities on the basis of a wet chemical etch process, which may have an anisotropic etch behavior with respect to different crystallographic orientations. In one embodiment, TMAH may be used which exhibits, in addition to the anisotropic etch behavior, a high etch selectivity with respect to silicon dioxide, thereby enabling extremely thin etch stop layers which additionally provide the possibility of further reducing the offset from the channel region while not unduly contributing to overall process variability.

16 Claims, 8 Drawing Sheets

TRANSISTOR WITH EMBEDDED SI/GE MATERIAL HAVING ENHANCED ACROSS-SUBSTRATE UNIFORMITY

BACKGROUND OF THE INVENTION

1. Field of the Invention

Generally, the present disclosure relates to the fabrication of integrated circuits, and, more particularly, to transistors having strained channel regions by using embedded Si/Ge (silicon/germanium) to enhance charge carrier mobility in the channel regions of the transistors.

2. Description of the Related Art

The fabrication of complex integrated circuits requires the provision of a large number of transistor elements, which represent the dominant circuit element for complex circuits. For example, several hundred millions of transistors may be provided in presently available complex integrated circuits. Generally, a plurality of process technologies are currently practiced, wherein, for complex circuitry, such as microprocessors, storage chips and the like, CMOS technology is currently the most promising approach due to the superior characteristics in view of operating speed and/or power consumption and/or cost efficiency. In CMOS circuits, complementary transistors, i.e., P-channel transistors and N-channel transistors, are used for forming circuit elements, such as inverters and other logic gates, to design highly complex circuit assemblies, such as CPUs, storage chips and the like. During the fabrication of complex integrated circuits using CMOS technology, transistors, i.e., N-channel transistors and P-channel transistors, are formed on a substrate including a crystalline semiconductor layer. A MOS transistor, or generally a field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed in the vicinity of the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Thus, the reduction of the channel length, and associated therewith the reduction of the channel resistivity, is a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. For example, highly sophisticated dopant profiles, in the vertical direction as well as in the lateral direction, are required in the drain and source regions to provide low sheet and contact resistivity in combination with a desired channel controllability. Moreover, the gate dielectric material may also be adapted to the reduced channel length in order to maintain the required channel controllability. However, some mechanisms for maintaining a high channel controllability may also have a negative influence on the charge carrier mobility in the channel region of the transistor, thereby partially offsetting the advantages gained by the reduction of the channel length.

Since the continuous size reduction of the critical dimensions, i.e., the gate length of the transistors, necessitates the adaptation and possibly the new development of highly complex process techniques and may also contribute to less pronounced performance gain due to mobility degradation, it has been proposed to enhance the channel conductivity of the transistor elements by increasing the charge carrier mobility in the channel region for a given channel length, thereby enabling a performance improvement that is comparable with the advance to a technology standard requiring extremely scaled critical dimensions, while avoiding or at least postponing many of the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region for a standard crystallographic configuration of the active silicon material, i.e., a (100) surface orientation with the channel length aligned to the <110> direction, increases the mobility of electrons, which in turn may directly translate into a corresponding increase in conductivity. On the other hand, compressive strain in the channel region may increase the mobility of holes, thereby providing the potential for enhancing the performance of P-type transistors. The introduction of stress or strain engineering into integrated circuit fabrication is an extremely promising approach, since strained silicon may be considered as a "new" type of semiconductor material, which may enable the fabrication of fast powerful semiconductor devices without requiring expensive semiconductor materials, while many of the well-established manufacturing techniques may still be used.

Consequently, it has been proposed to introduce, for instance, a silicon/germanium (Si/Ge) material next to the channel region to induce a compressive stress that may result in a corresponding strain. When forming the Si/Ge material, the drain and source regions of the PMOS transistors are selectively recessed to form cavities, while the NMOS transistors are masked, and subsequently the silicon/germanium material is selectively formed in the cavities of the PMOS transistor by epitaxial growth.

Although the technique has significant advantages in view of performance gain of P-channel transistors and thus of the entire CMOS device, it turns out, however, that, in advanced semiconductor devices including a large number of transistor elements, an increased variability of device performance may be observed, which may be associated with the above-described technique for incorporating a strained silicon/germanium alloy in the drain and source regions of P-channel transistors, in particular when the offset of the silicon/germanium material from the channel region is to be reduced in view of increasing the finally achieved strain, as will be described in more detail with reference to FIGS. 1a-1e.

FIG. 1a schematically illustrates a cross-sectional view of a conventional semiconductor device 100 comprising a P-channel transistor 150A and an N-channel transistor 150B, wherein the performance of the transistor 150A is to be enhanced on the basis of a strained silicon/germanium alloy, as explained above. The semiconductor device 100 comprises a substrate 101, such as a silicon substrate, which may have formed thereon a buried insulating layer 102. Furthermore, a crystalline silicon layer 103 is formed on the buried insulating layer 102, thereby forming a silicon-on-insulator (SOI) configuration. An SOI configuration may be advantageous in view of overall transistor performance since, for instance, the parasitic junction capacitance of the transistors 150A, 150B may be reduced compared to a bulk configuration, i.e., a configuration in which a thickness of the silicon layer 103 may be significantly greater than a vertical extension of the transistors 150A, 150B into the layer 103. The transistors 150A, 150B may be formed in and above respective "active" regions, generally indicated as 103A, 103B, respectively, wherein the active regions may be separated by an isolation structure 104, such as a shallow trench isolation. In the manufacturing stage shown, the transistors 150A, 150B comprise a gate electrode structure 151, which may be understood as a structure including a conductive electrode material 151A, representing the actual gate electrode, which may be formed on a gate insulation layer 151B, thereby electrically insulating the gate electrode material 151A from a channel region 152 located within the corresponding active regions 103A, 103B, respectively. Furthermore, the gate electrode structures 151 may comprise a cap layer 151L, for instance comprised of silicon nitride. Furthermore, a spacer structure 105 may be formed on sidewalls of the gate electrode structure 151 in the transistor 150A, thereby encapsulating, in combination with the cap layer 151L, the gate electrode material 151A. On the other hand, a mask layer 105A may be formed above the transistor 150B, thereby encapsulating the corresponding gate electrode material 151A and also covering the active region 103B. Moreover, a mask 106, such as a resist mask and the like, may be formed to cover the mask layer 105A while exposing the transistor 150A.

The conventional semiconductor device 100 as shown in FIG. 1a may be formed on the basis of the following process strategy. The active regions 103A, 103B may be defined on the basis of the isolation structure 104, which may be formed by using well-established photolithography, etch, deposition and planarization techniques. Thereafter, the basic doping level in the corresponding active regions 103A, 103B may be established, for instance, by implantation processes performed on the basis of an appropriate masking regime. Next, the gate electrode structures 151 are formed by using complex lithography and patterning regimes to obtain the gate electrode material 151A and the gate insulation layer 151B, wherein the cap layer 151L may also be patterned. Next, the mask layer 105A may be deposited, for instance, by well-established low pressure chemical vapor deposition (CVD) techniques, thereby forming silicon nitride, possibly in combination with a silicon dioxide material as an etch stop liner. The low pressure CVD techniques may, although providing a high degree of controllability, nevertheless exhibit a certain non-uniformity across the substrate 101, which may result in an increased thickness at the substrate edge compared to the center of the substrate. Consequently, upon forming the mask 106 and exposing the device 100 to an anisotropic etch ambient for forming the spacer structure 105 from the previously deposited mask layer 105A, a certain degree of non-uniformity of the resulting width 105W may be created, which may, for instance, result in slightly increased width at the periphery of the substrate 101 compared to central areas of the substrate 101. Since the spacer structure 105 may substantially define a lateral offset of a cavity to be formed in the active region 103A by anisotropic etch techniques, the corresponding lateral offset may also vary slightly according to the non-uniformities introduced during the deposition of the mask layer 105A and the performing of the subsequent anisotropic etch process. On the other hand, in sophisticated applications, a lateral offset of a corresponding strained silicon/germanium alloy may be reduced in view of enhancing the overall strain in the adjacent channel region 152, thereby requiring the width 105W to be reduced to position the strained silicon/germanium alloy closer to the channel region 152. Typically, the strain in the channel region 152 may increase over proportionally for a reduced width 105W so that, in process strategies to provide a moderately small width 105W, the variability caused by the deposition of the layer 105A and the subsequent etch process may be increased over proportionally, thereby contributing to a high degree of variability of the resulting performance of the transistors 150A.

FIG. 1b schematically illustrates the semiconductor device 100 during an anisotropic plasma assisted etch process 107, in which appropriate etch chemistries, for instance on the basis of hydrogen bromide and the like, may be used in combination with appropriate organic additives so that the corresponding anisotropic etch behavior may be obtained in combination with appropriately selected plasma conditions. However, as explained above, a certain degree of variability may also be induced during the plasma assisted etch process 107, thereby also contributing to the overall variability, in particular if highly sophisticated transistors are considered in which even a minute difference in the lateral offset may thus result in a significant change of transistor performance. Consequently, due to the varying width 105W caused by the preceding deposition of the layer 105A and the corresponding anisotropic etch process for forming the spacer structure 105, possibly in combination with the anisotropic etch process 107 used for forming respective cavities 107A, the position and size thereof may also exhibit a corresponding degree of variability.

FIG. 1c schematically illustrates the semiconductor device 100 in a further advanced manufacturing stage. That is, after forming the cavities 107A, the mask 106 (FIG. 1b) is removed and a selective epitaxial growth process is performed to deposit a silicon/germanium alloy 109 in the transistor 150A, while the transistor 150B is covered by the mask layer 105A. Corresponding selective epitaxial growth recipes are well established, in which the corresponding process parameters, such as pressure, temperature, precursor flow rates and the like, are appropriately selected to obtain a significant deposition of the silicon/germanium material on exposed crystalline silicon surfaces, while a corresponding material deposition on dielectric surface areas is significantly reduced or even negligible. Thus, the silicon/germanium material 109 may be grown in a strained state, since the natural lattice constant of silicon/germanium is greater than the lattice constant of silicon, thereby obtaining a compressively strained material, which may also result in a corresponding compressive strain in the adjacent channel region 152. The magnitude of the compressive strain may depend on the position and the size of the previously formed cavities and on the germanium concentration within the material 109. Thus, for given process parameters during the selective epitaxial growth process for forming the material 109, the variability of the preceding manufacturing processes for forming the mask layer 105A, patterning the spacer structure 105 and forming the cavities 107A may thus result in a certain non-uniformity of transistor performance across the substrate 101.

FIG. 1d schematically illustrates the semiconductor device 100 in a further advanced manufacturing stage in which the mask layer 105A, the spacer structure 105 and the cap layers 151L (see FIG. 1c) are removed, which may be accomplished by well-established selective etch techniques. Thereafter, the further processing may be continued by forming drain and source regions according to the device requirements.

FIG. 1e schematically illustrates the semiconductor device 100 in a manufacturing stage in which the basic transistor configuration is substantially completed. As illustrated, the transistors 150A, 150B may comprise a sidewall spacer structure 153, which may include one or more spacer elements 153A, possibly in combination with corresponding etch stop liners 153B, depending on the required complexity of the dopant profile of drain and source regions 154. The spacer structure 153 may be formed in accordance with well-established techniques, i.e., by depositing the etch stop liner 153B and a corresponding mask layer which may then be patterned by anisotropic etch processes to form the spacer element 153A. Prior to forming the spacer structure 153, appropriate implantation processes may be performed to define extension regions 154E, which in combination with deep drain and source areas 154D, which may be formed on the basis of the spacer structure 153, represent the drain and source regions 154. Thereafter, the dopants may be activated by annealing the device 100, thereby also re-crystallizing, at least to a certain degree, implantation-induced damage. Thereafter, the further processing may be continued by forming metal silicide regions and forming a corresponding contact structure, possibly on the basis of stressed dielectric materials, in accordance with well-established process strategies. As explained above, for sophisticated applications, performance of the transistor 150A may be substantially determined by the strain-inducing mechanism provided by the silicon/germanium alloy 109, wherein the moderately high degree of variability, in particular for a desired reduced lateral offset of the silicon/germanium material 109 from the channel region 152, may cause a reduced production yield, while in other cases the potential of the strain-inducing mechanism provided by the material 109 may not be fully exploited since a corresponding offset from the channel region 152 has to be maintained greater than desirable.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which cavities may be formed in active regions of transistor devices with a well controlled lateral offset with respect to the channel region on the basis of a wet chemical etch process that has a high crystallographic anisotropy so that precise control of the lateral offset may be accomplished without requiring sophisticated spacer structures. In some illustrative aspects disclosed herein, a crystallographically anisotropic etch process may be accomplished by using tetra methyl ammonium hydroxide (TMAH), which may be an efficient wet chemical etch chemistry for etching silicon with a high degree of selectivity with respect to silicon dioxide, thereby enabling a significantly reduced thickness of an etch stop material for protecting gate electrode structures while also providing a highly stable and reproducible wet chemical etch process. Consequently, due to the reduced degree of variability of the wet chemical etch process itself and its good controllability in combination with a high etch selectivity, an offset of corresponding cavities may be significantly reduced, substantially without suffering from across-substrate variability, which is conventionally caused by the deposition of a spacer material in combination with corresponding plasma assisted etch processes for patterning the spacers and forming the corresponding cavities. Furthermore, by using a highly controllable wet chemical etch process and by avoiding the deposition of a pronounced layer thickness for a corresponding spacer material, the overall process throughput may be significantly increased compared to conventional strategies in which, in particular, the etch processes for patterning the spacer material and obtaining the cavities are typically performed as single wafer processes.

One illustrative method disclosed herein comprises forming a dielectric etch stop material on exposed surface areas of a gate electrode structure of a transistor formed above a silicon-containing crystalline semiconductor region. The method further comprises forming cavities in the crystalline semiconductor region adjacent to the gate electrode structure by performing a wet chemical etch process having different removal rates in at least two different crystallographic orientations of the crystalline semiconductor region. Moreover, the method comprises forming a strain-inducing semiconductor alloy at least in the cavities by performing a selective epitaxial growth process. Finally, the method comprises forming drain and source regions in at least a portion of the strain-inducing semiconductor alloy.

A further illustrative method disclosed herein comprises forming cavities in a crystalline semiconductor region adjacent to a gate electrode structure of a transistor formed above a portion of the crystalline semiconductor region by performing a wet chemical etch process on the basis of tetra methyl ammonium hydroxide (TMAH). The method further comprises forming a strain-inducing semiconductor alloy in the cavities and forming drain and source regions in the semiconductor region adjacent to the gate electrode structure.

One illustrative semiconductor device disclosed herein comprises a transistor formed above a substrate. The transistor comprises a gate electrode structure formed above a crystalline semiconductor region and comprising a gate electrode material. Furthermore, a strain-inducing semiconductor alloy is formed in the crystalline semiconductor region so as to extend along a depth direction in a tapered manner with a sidewall angle of approximately 30 degrees or more. Finally, the transistor comprises drain and source regions formed in the crystalline semiconductor region and at least partially in the semiconductor alloy.

BRIEF DESCRIPTION OF THE DRAWINGS

The disclosure may be understood by reference to the following description taken in conjunction with the accompanying drawings, in which like reference numerals identify like elements, and in which.

Figure 1A:
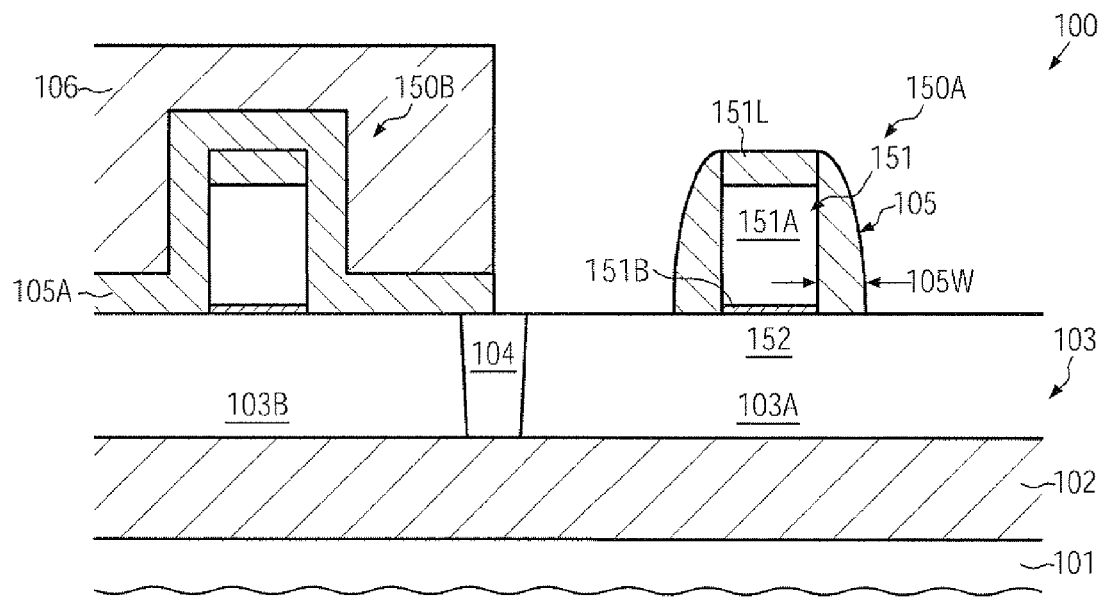
FIGS. 1a-1e schematically illustrate cross-sectional views of a conventional semiconductor device comprising a P-channel transistor during various manufacturing stages in forming a silicon/germanium alloy on the basis of complex deposition processes and plasma assisted etch techniques.
Figure 1B:
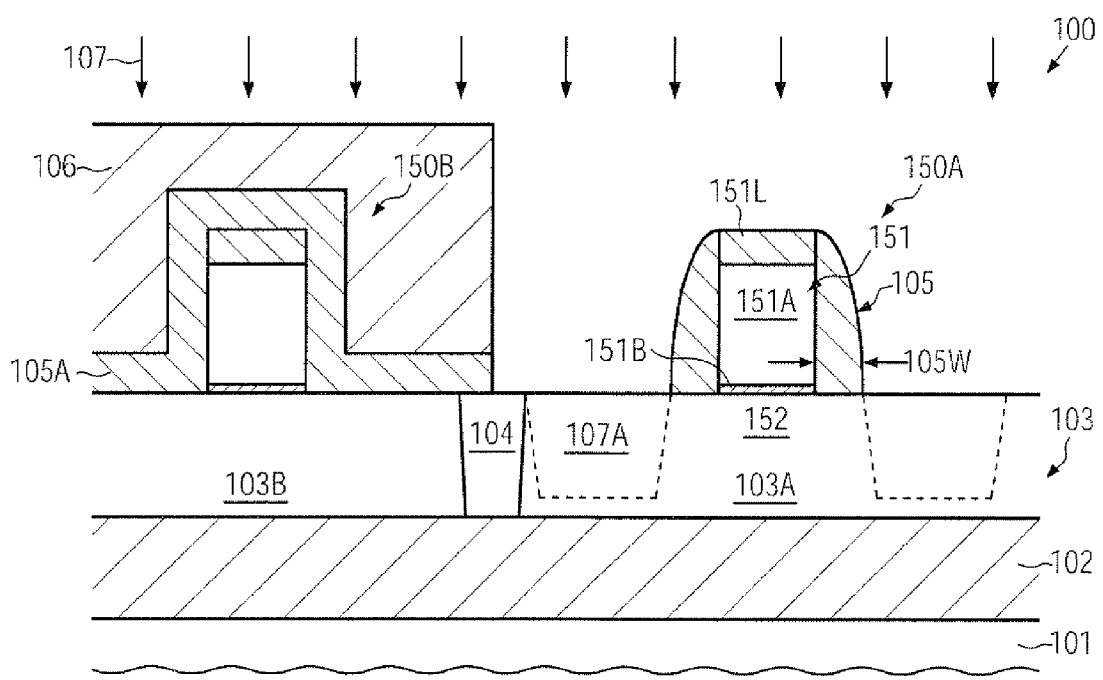
Figure 1C:
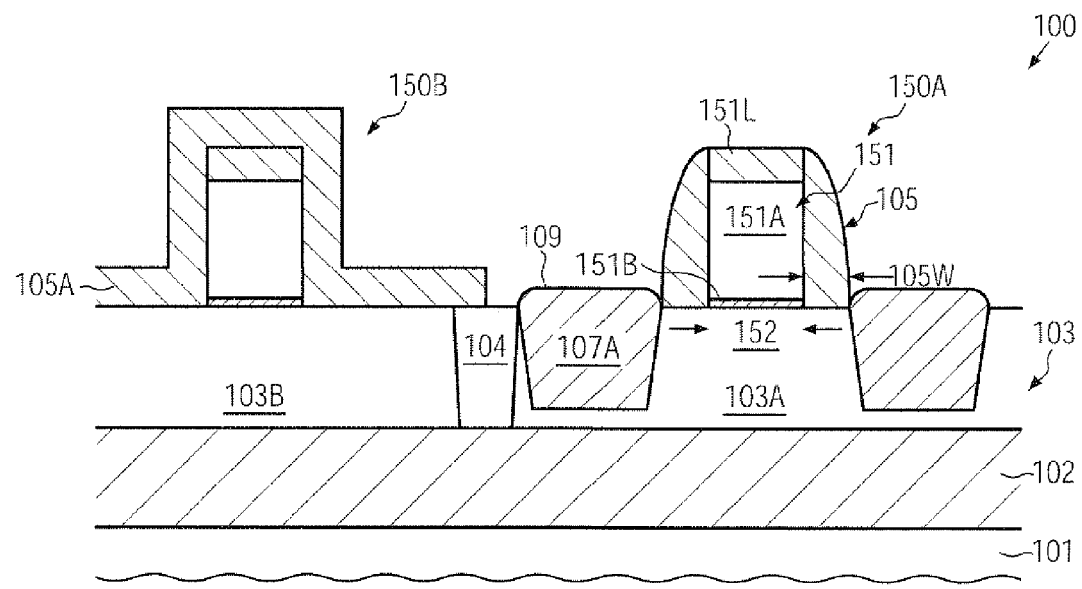
Figure 1D:
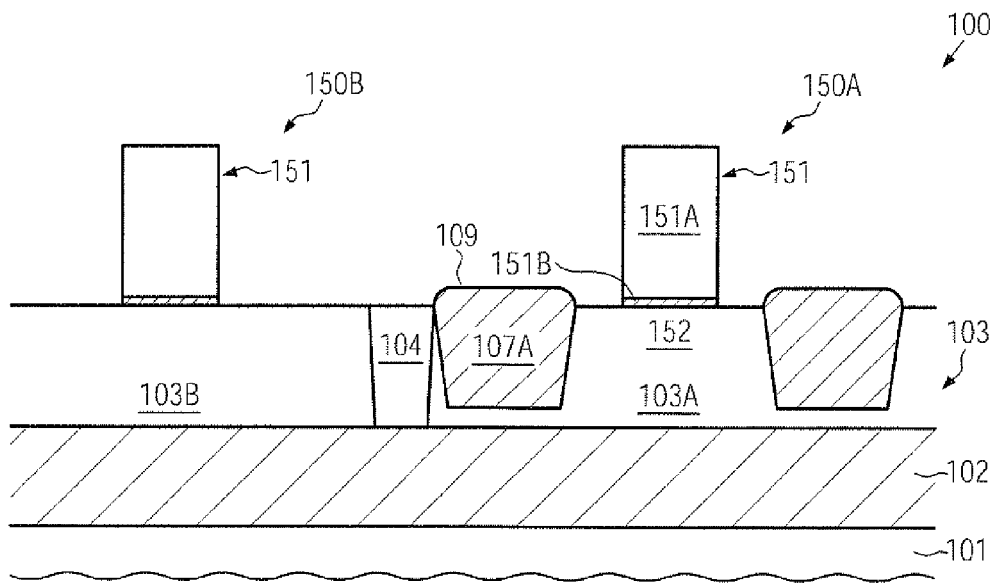
Figure 1E:
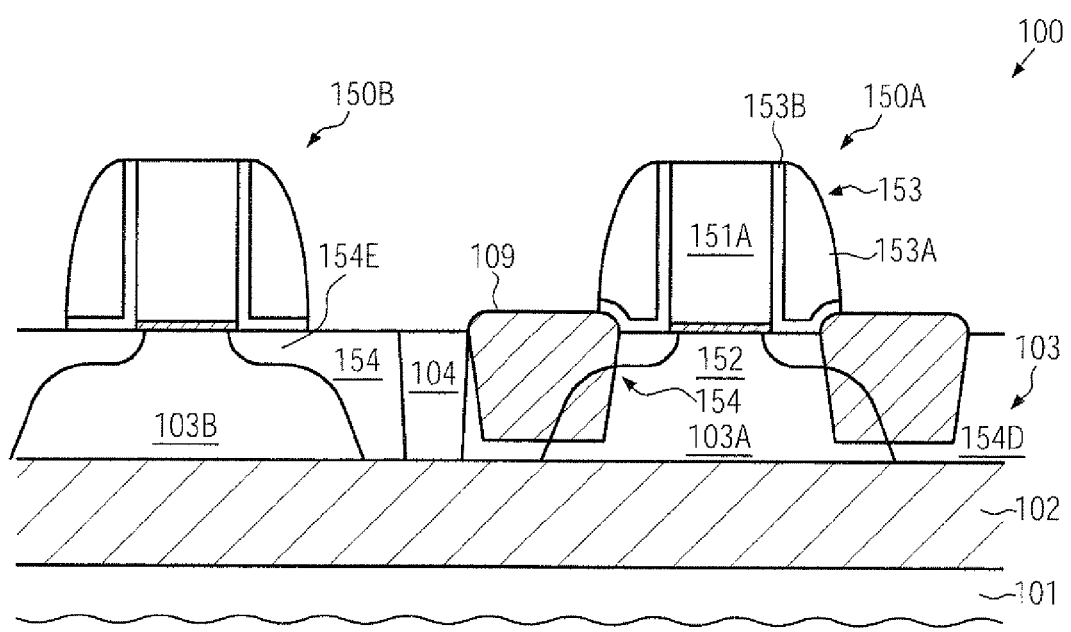

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides techniques and semiconductor devices in which enhanced uniformity may be accomplished during a manufacturing sequence for incorporating a strained semiconductor alloy adjacent to channel regions of transistor devices, while also providing the possibility of positioning the corresponding semiconductor alloy in close proximity to the channel region. To this end, well controllable and reproducible wet chemical etch techniques may be used for forming the corresponding cavities, wherein the wet chemical etch chemistry may have an inherent "anisotropic" etch behavior with respect to different crystallographic orientations of the semiconductor material to be patterned. Consequently, in some illustrative aspects, the crystallographic configuration of the basic semiconductor material may be appropriately selected so that the inherent difference in etch rate may provide a "self-restricting" etch behavior in the lateral direction so that, for a given initial lateral offset at the beginning of the etch process, respective cavities with enhanced overall uniformity across individual substrates may be obtained. For example, in some illustrative embodiments, a standard crystallographic orientation of silicon material, that is, a (100) surface orientation with the transistor length directions oriented along a <110> direction, may be used, thereby taking advantage of a significantly reduced etch rate along <111> direction compared to other directions, such as a <110>, <100> direction and the like. It should be appreciated that throughout this application corresponding crystallographic orientations are to be understood as representing physically equivalent orientations, i.e., a (100) orientation is to be understood as enclosing any physically equivalent orientations, such as (010), (001), (−100) and the like. The same holds true for any other crystallographic orientation. Based on the wet chemical etch process having the inherent high degree of uniformity and reproducibility, appropriate masking regimes may also be provided to enable a significant reduction of the lateral offset of the semiconductor alloy to be formed in the corresponding cavities obtained by the wet chemical etch process. In some illustrative embodiments disclosed herein, the wet chemical etch process may be performed on the basis of TMAH, which, in addition to the crystallographically anisotropic etch behavior, also exhibits a very pronounced etch selectivity for silicon and silicon dioxide, wherein silicon dioxide may be etched with a significantly reduced rate compared to silicon. Thus, even a very thin silicon dioxide layer may be efficiently used as an etch stop material for encapsulating the gate electrode structure, which may thus provide the potential for adjusting the corresponding thickness with a high degree of uniformity so that even very small lateral offsets, which is advantageous in view of strain enhancement, at a reduced degree of variability may be accomplished. Moreover, in some illustrative embodiments, the wet chemical etch process may be controlled on the basis of an indicator species or etch stop species, which may be introduced into the basic semiconductor layer, for instance, by ion implantation, selective epitaxial growth and the like. In some illustrative embodiments an N-type dopant species may be positioned at a specific depth within the silicon material in order to provide an efficient etch control, since, for instance, TMAH may have a significantly reduced removal rate for N-type silicon material. In other cases, prominent indicator species may be incorporated which may be detectable within the wet chemical etch solution, thereby also providing enhanced controllability of the wet chemical etch process.

With reference to FIGS. 2a-2j, further illustrative embodiments will now be described in more detail, wherein reference may also be made to FIGS. 1a-1e, if appropriate.

Figure 2A:
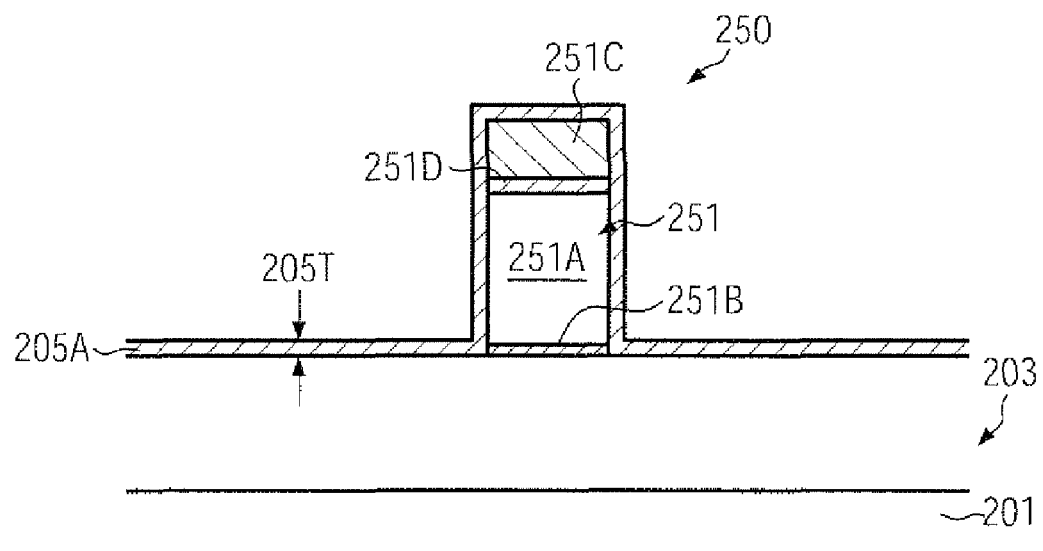
FIGS. 2a-2c schematically illustrate cross-sectional views of a semiconductor device at various manufacturing stages in which a transistor receives cavities on the basis of a wet chemical etch process, according to illustrative embodiments.

FIG. 2a schematically illustrates a cross-sectional view of a transistor 250 at an early manufacturing stage. The transistor 250 may represent any type of transistor, the performance of which is to be enhanced by providing an embedded semiconductor alloy so as to create a specified type of strain. The transistor 250 may comprise a substrate 201, above which may be formed a semiconductor region 203. The semiconductor region 203 may represent an active region for accommodating a single transistor or a plurality of transistors of the same or a different conductivity type, depending on the overall device requirements. With respect to the substrate 201 and the semiconductor region 203, similar criteria may apply as previously explained with reference to the device 100. That is, the semiconductor region 203 may represent a part of a corresponding silicon-based semiconductor layer, which may be separated into individual active regions by providing a corresponding isolation structure (not shown). Furthermore, the region 203 and the substrate 201 may represent an SOI configuration if a corresponding buried insulating layer (not shown) is positioned between the region 203 and the substrate 201. In other cases, the region 203 and the substrate 201 may define a bulk configuration, as is also explained above with reference to the device 100. The transistor 250 may comprise a gate electrode structure 251, which may represent a gate electrode material 251A, such as polycrystalline silicon and the like, in combination with a gate insulation layer 251B. For example, the gate electrode structure 251 may have a gate length, i.e., a horizontal extension of the gate electrode material 251A of approximately 50 nm and significantly less, if sophisticated semiconductor devices are considered. Moreover, in some illustrative embodiments, a cap layer 251C may be formed above the gate electrode material 251A and an etch stop layer 251D may be formed between the gate electrode material 251A and the cap layer 251C. For example, the cap layer 251C may be comprised of silicon nitride when a high degree of compatibility with conventional strategies, as previously described with respect to the device 100, is considered appropriate. On the other hand, the etch stop layer 251D may be comprised of silicon dioxide. Furthermore, an etch stop liner 205A may be formed on the semiconductor region 203 and the gate electrode structure 251. In one illustrative embodiment, the etch stop liner 205A may be comprised of silicon dioxide.

The transistor device 250 as shown in FIG. 2a may be formed on the basis of the following processes. After defining the semiconductor region 203, for instance on the basis of isolation structures, as is also described, for instance, with respect to the device 100, the gate electrode structure 251 may be formed, which may be accomplished on the basis of well-established process techniques, as previously described, wherein, however, after depositing the gate electrode material 251A, the etch stop material 251D may be formed, followed by the deposition of the cap layer 251C. Thereafter, a patterning strategy may be used to pattern the cap layer 251C and the etch stop material 251D, followed by well-established silicon etch techniques for obtaining the gate electrode material 251A, as illustrated in FIG. 2a. Next, the etch stop liner 205A may be formed, for instance, by deposition, using well-established process techniques, wherein a thickness 205T may be selected in accordance with process requirements in view of obtaining a desired offset of a cavity still to be formed in the region 203. For example, the thickness 205T may be selected to be approximately 5 nm and less, such as 2 nm and less, if a corresponding small offset with respect to the gate electrode material 251A is desired. For this purpose, appropriate process techniques, such as low pressure CVD and the like, may be used, wherein the reduced thickness 205T may provide enhanced overall across-substrate uniformity. In other cases, the layer 205A may be formed by an oxidation process, in which case the layer 205A may not cover the cap layer 251C. Also in this case, a highly controllable process for obtaining a desired thickness 205T may be accomplished.

Figure 2B:
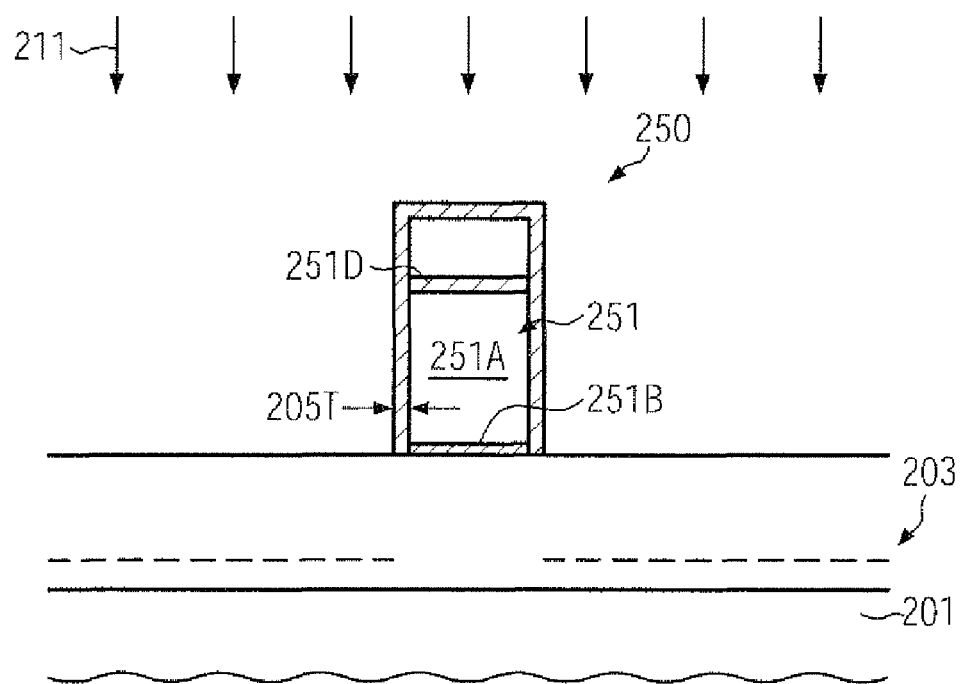

FIG. 2b schematically illustrates the transistor 250 during an anisotropic etch process 211 that is designed to selectively remove material of the layer 205A with respect to the semiconductor region 203 and possibly with respect to the cap layer 251C. It is to be appreciated that respective highly selective plasma assisted etch processes for silicon dioxide are well established in the art and may be used for the process 211. Consequently, respective "sidewall spacers" may be obtained on sidewalls of the gate electrode structures 251 with a thickness that substantially corresponds to the thickness 205T except for a very minute reduction in thickness caused by the etch process 211. It should be appreciated, however, that, due to the reduced thickness 205T, exposure to the ambient of the process 211 may be moderately short so that corresponding etch process related variations may be very small.

Figure 2C:
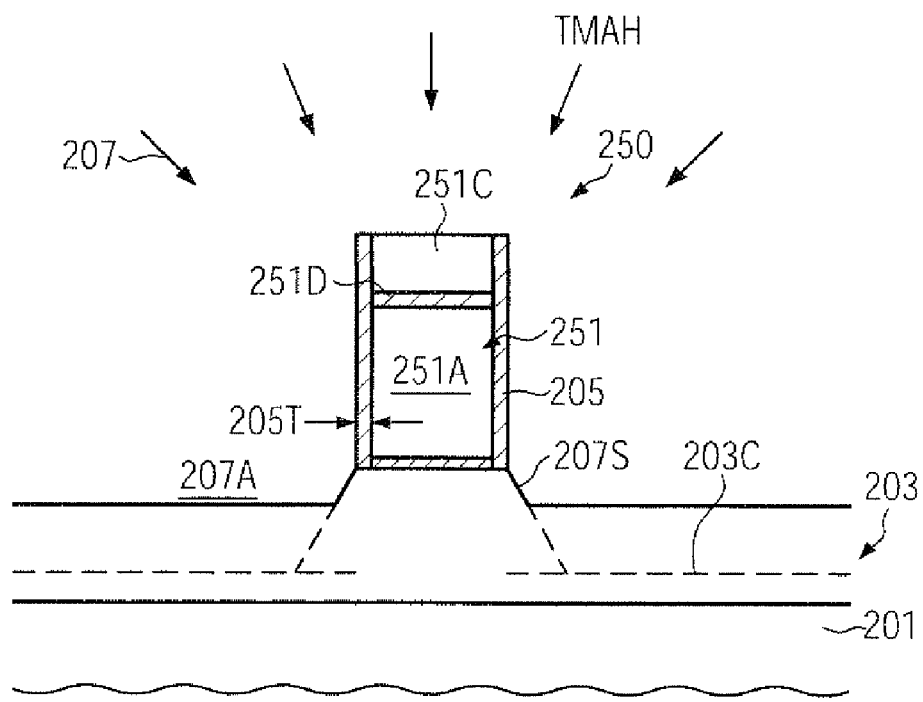

FIG. 2c schematically illustrates the transistor 250 during a wet chemical etch process 207, which may have a different etch rate in the horizontal direction compared to the vertical direction. That is, the wet chemical etch chemistry of the process 207 may have a different intrinsic removal rate with respect to different crystallographic orientations, and may thus etch differently in the vertical and lateral direction, since the crystalline semiconductor region 203 has different crystallographic orientations with respect to these directions, depending on the crystallographic configuration of the silicon base material of the region 203. For example, the wet chemical etch chemistry may have a reduced etch rate along the <111> crystallographic orientation, which may result in a lateral restriction of the etch front, thereby creating sidewalls 207S of corresponding cavities 207A which are inclined according to the spatial orientation of the corresponding <111> direction. In one illustrative embodiment, the wet chemical etch chemistry of the process 207 may be established on the basis of tetra methyl ammonium hydroxide (TMAH) which may also be used as a resist developing material and which may also have a high etch rate for silicon material, wherein a high etch selectivity with respect to silicon dioxide may also be obtained. Consequently, upon exposure of the device 250 to the ambient of the process 207, the spacers 205 may efficiently protect the gate electrode structure 251 so that an offset of the cavities 207A may be substantially determined by the width 205T, wherein lateral offset may increase during the advance of the wet chemical etch process 207 in a highly controllable and predictable manner according to the spatial orientation of the crystallographic axes of the region 203. It should be appreciated that if the cap layer 251C does not exhibit a specific etch resistance with respect to the process 207, the etch stop layer 251 still provides integrity of the gate electrode material 251A. Moreover, in some illustrative embodiments, an etch control species 203C may be centered around a specified depth in order to control the etch process 207, i.e., to adjust a depth of the cavities 207A with enhanced uniformity. For example, the etch control species 203C may be provided in the form of an N-type dopant species, such as arsenic, so as to obtain an N-doped silicon area, which may have a significantly reduced etch rate when being exposed to wet chemical chemistry of the process 207 based on TMAH. The etch control species 203C may be provided by ion implantation, epitaxial growth techniques and the like, as will also be described later on in more detail.

Figure 2D:
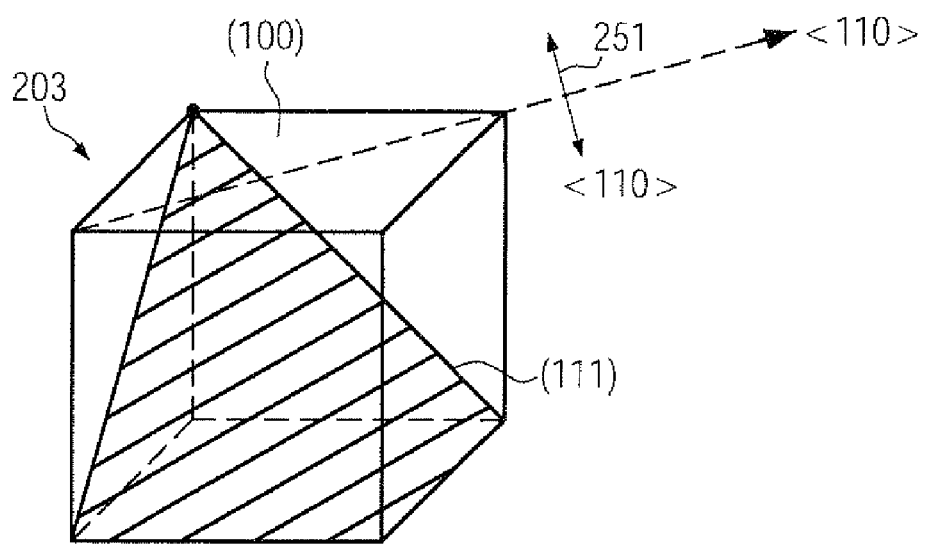
FIG. 2d schematically illustrates the crystallographic configuration of a silicon material during the wet chemical etch process, according to illustrative embodiments.

FIG. 2d schematically illustrates the crystallographic configuration of the semiconductor region 203 according to one illustrative embodiment in which a pronounced etch resistivity may be obtained on the basis of a (111) plane so that the advance of an etch front along a <111> direction may be significantly reduced compared to the advance along other crystallographic directions. As illustrated, a portion of a cubic lattice configuration of a silicon material is illustrated, wherein a (100) surface layer may be provided in accordance with standard basic semiconductor wafers used in the semiconductor industry. Moreover, the gate electrode structure 251 may be positioned with its length direction, i.e., in FIG. 2c the horizontal extension of the gate electrode material 251A along the <110> direction. In this case, the (111) planes may form an angle of approximately 35, 26 degrees with respect to the corresponding (110) planes, which may thus also substantially represent the sidewall angle of the sidewalls 207S (FIG. 2c) during the advance of wet chemical etch process. It should be appreciated, however, that if different sidewall angles may be desired, respective different crystallographic configurations may be selected for the base material 203 for a given anisotropic etch behavior of the corresponding etch chemistry. That is, the crystallographic orientation of the base material 203 may be appropriately "rotated" to obtain a different sidewall angle, as long as a corresponding gain in transistor performance may still be obtained for the respective "rotated" crystallographic orientation.

Figure 2E:
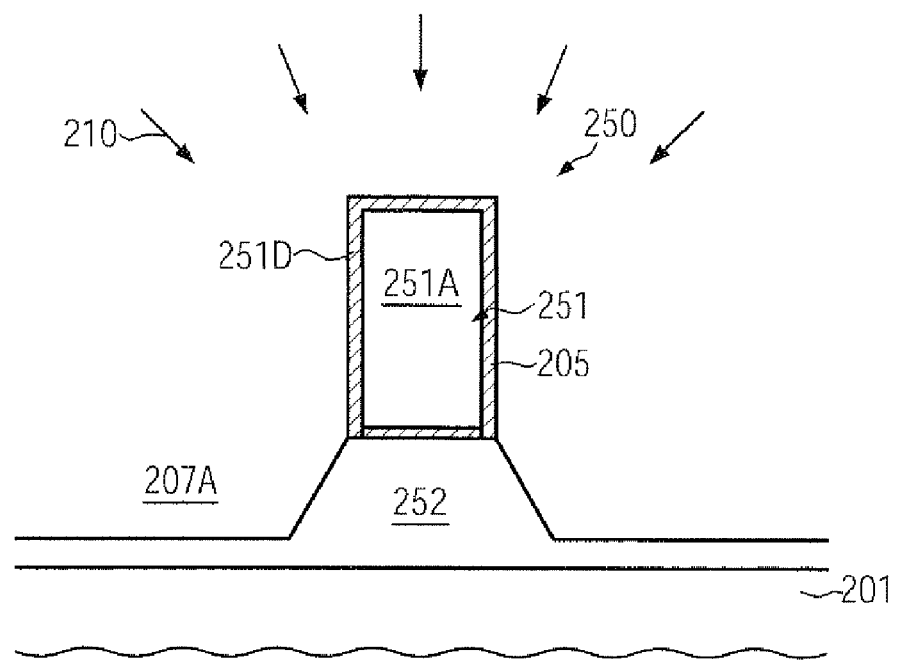
FIGS. 2e-2f schematically illustrate cross-sectional views of the transistor during further advanced manufacturing stages in forming a strain-inducing semiconductor alloy with reduced variability and close proximity to the channel region, according to illustrative embodiments.

FIG. 2e schematically illustrates the transistor 250 with the cavities 207A extending down to a specified depth, which, for instance, may be determined by the etch control species 203C (FIG. 2c), or which may be adjusted on the basis of a time controlled etch strategy. It should be appreciated that the cavities 207A may be obtained on the basis of a high throughput etch process since a plurality of substrates may be simultaneously processed in a corresponding wet chemical etch reactor, thereby providing significant advantages compared to conventional plasma assisted etch steps, typically requiring a single substrate process technique.

As illustrated, if the cap layer 251C (FIG. 2c) may not exhibit a pronounced etch resistivity, the etch stop layer 251D may be exposed during the preceding wet chemical etch process. Thus, the etch stop layer 251D may act for maintaining integrity of the gate electrode material 251A while also acting as a growth mask during a selective epitaxial growth process 210. During the process 210, an appropriate semiconductor alloy, such as a silicon/germanium alloy, a silicon/germanium/tin alloy, a silicon/tin alloy, may be deposited when the transistor 250 may represent a transistor requiring a compressive stress in a channel region 252. In other cases, a silicon/carbon material may be deposited during the process 210, thereby providing a tensile stressed semiconductor alloy, which may result in a corresponding tensile strain in the channel region 252. Moreover, during the selective epitaxial growth process, which may be performed on the basis of appropriately selected process parameters, the fractions of the individual components may be adjusted and, if required, a dopant species may be added, wherein the concentration of any dopant species as well as the concentration of corresponding alloy components may be varied during the process 210, if considered appropriate. Due to the highly uniform and controllable formation of the cavities 207A, increased flexibility may also be achieved for the process 210, since any specific adaptation of device characteristics on the basis of varying dopant concentration and/or concentration of components of the semiconductor alloy may otherwise be superimposed on the increased variability caused by conventional process techniques, as previously described.

Figure 2F:
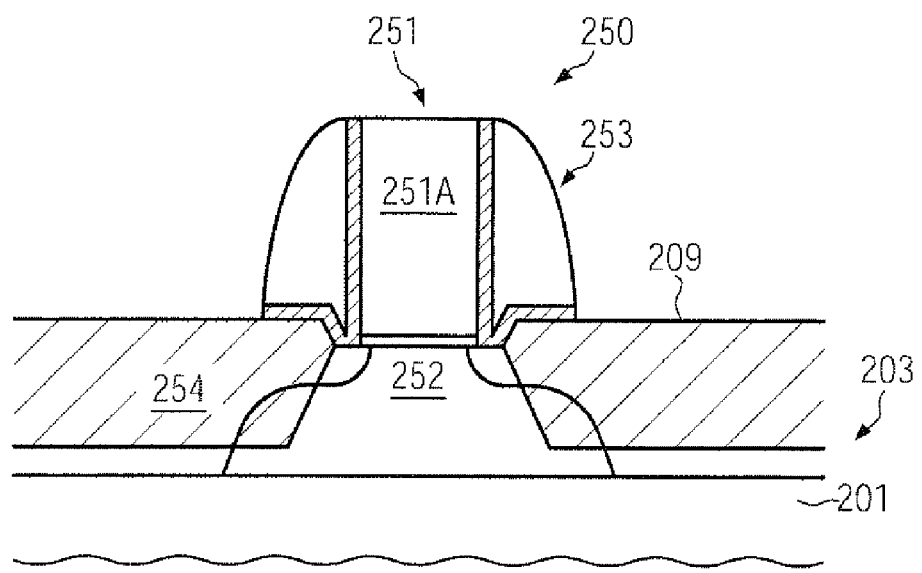

FIG. 2f schematically illustrates the transistor 250 in a further advanced manufacturing stage. As shown, a semiconductor alloy 209, such as the alloys described above, may be formed within the region 203 so as to induce a certain type of strain in the adjacent channel region 252, wherein the reduced lateral offset may provide increased efficiency of the strain transfer. Furthermore, drain and source regions 254 are defined in the region 203 and partially in the semiconductor alloy 209. Moreover, a sidewall spacer structure 253 may be formed on sidewalls of the gate electrode structure 251. The transistor 250 as shown in FIG. 2a may be formed on the basis of similar process strategies as previously described with reference to the device 100 wherein, however, due to the close proximity of the semiconductor alloy 209 to the channel region 252, for otherwise identical device and process parameters, an enhanced overall transistor performance may be obtained, while on the other hand overall variability, that is, across-substrate uniformity, of the corresponding transistor characteristics may be enhanced compared to conventional strategies.

Figure 2G:
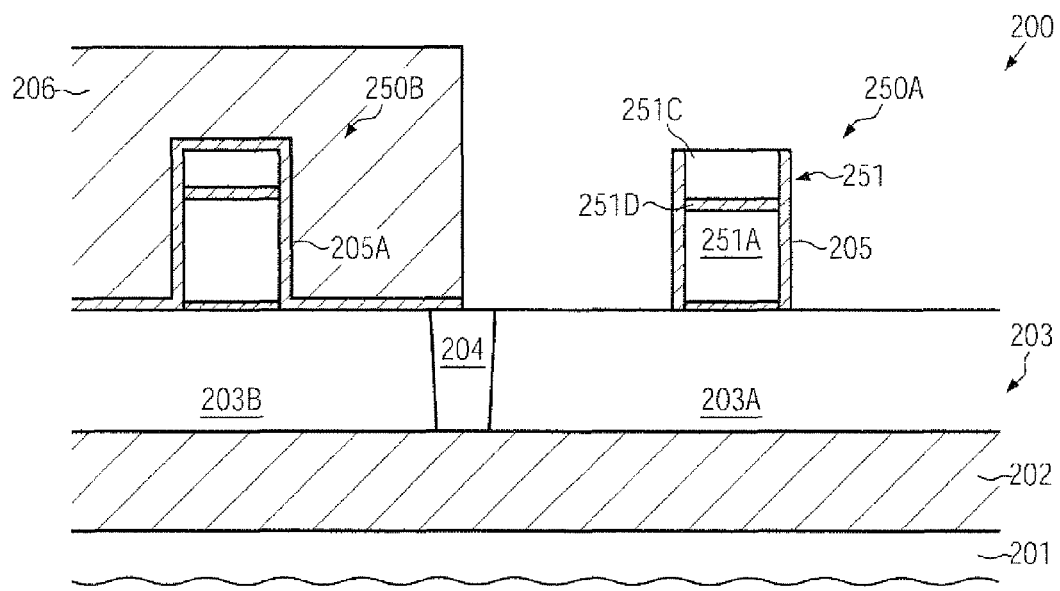
FIG. 2g schematically illustrates a cross-sectional view of a semiconductor device in which different transistors may be provided, one of which may obtain a semiconductor alloy, according to illustrative embodiments.

FIG. 2g schematically illustrates a semiconductor device 200 comprising transistors 250A, 250B at an early manufacturing stage. As illustrated, the transistors 250A, 250B may have a similar configuration as is also described with reference to FIG. 2a. That is, the transistors 250A, 250B may comprise the gate electrode structure 251 formed above corresponding active regions 203A, 203B. The active regions 203A, 203B may be separated by an isolation structure 204, as is also explained with reference to the device 100. Furthermore, in the manufacturing stage shown, the spacer 205 may be formed on sidewalls of the gate electrode structure 251, while the structure 251 of the transistor 250B may be covered by the mask layer 205A. Furthermore, a mask 206, such as a resist mask, may be provided to cover the transistor 250B while exposing the transistor 250A.

With respect to a manufacturing technique for forming the semiconductor device 200, it may be referred to corresponding process strategies as described with reference to the transistor 250. That is, after forming the mask layer 205A, the resist mask or any other etch mask 206 may be formed and may be used to obtain the spacers 205, while maintaining the mask layer 205A above the active region 203B. Thereafter, the mask 206 may be removed or may be maintained, depending on the etch resistivity with respect to the wet chemical etch process 207 (FIG. 2b). Thus, the mask layer 205A may act as an etch mask if the mask 206 is to be removed and may also act as a growth mask during the subsequent selective epitaxial growth process. Consequently, the mask layer 205A having a moderately small layer thickness may also be efficiently used for covering device areas, such as the transistor 250B, in which a semiconductor alloy may not be required. After forming the semiconductor alloy in the transistor 250A, the further processing may be continued on the basis of well-established process strategies, as are also described with reference to the device 100.

Figure 2H:
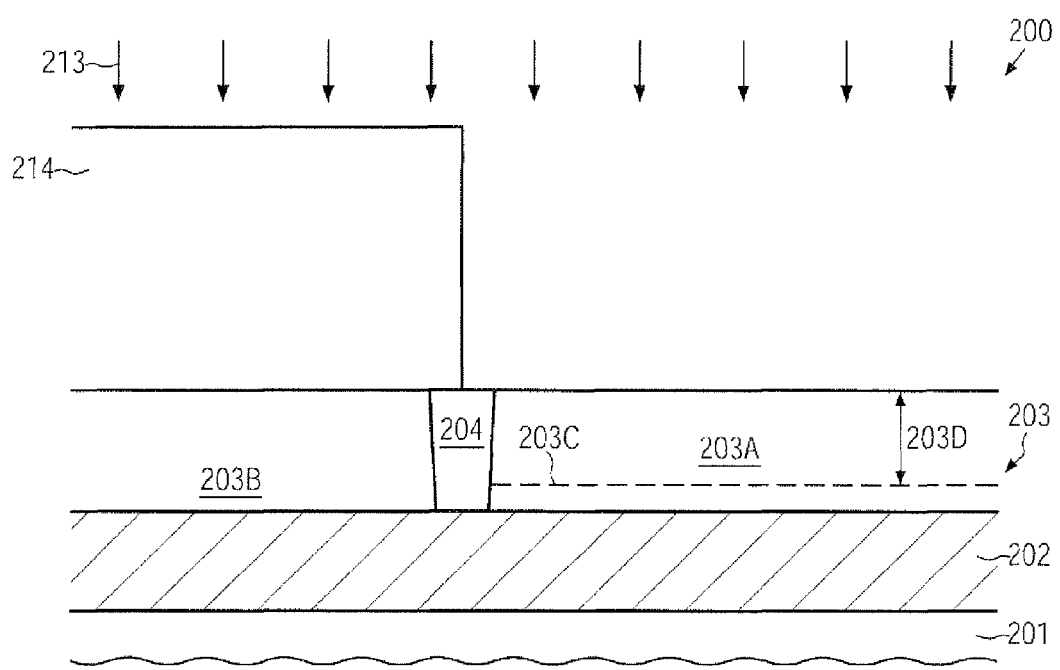
FIGS. 2h-2j schematically illustrate cross-sectional views of the semiconductor device according to various variants in providing a species at a specified depth within the basic semiconductor layer to enhance control of the wet chemical etch process, according to still further illustrative embodiments.

FIG. 2h schematically illustrates the semiconductor device 200 in an early manufacturing stage, i.e., prior to forming the gate electrode structures 251. In this manufacturing stage, the basic doping concentration for the region 203A may be defined on the basis of a corresponding implantation sequence 213 while covering the active region 203B by an implantation mask 214. In one illustrative embodiment, the implantation sequence 213 may also comprise an implantation step for introducing etch control species 203C at a specific depth 203D, which may substantially correspond to the desired depth of cavities to be formed in the region 203A in a later manufacturing stage. For example, if the region 203A represents the active region of a P-channel transistor, the additional N-type dopant species 203C may substantially not affect the overall transistor characteristics. It should be appreciated that, in other illustrative embodiments, a corresponding implantation step for introducing the etch control species 203C may be performed after providing the gate electrode structure 251, as is for instance shown and explained with reference to FIG. 2a.

Figure 2I:
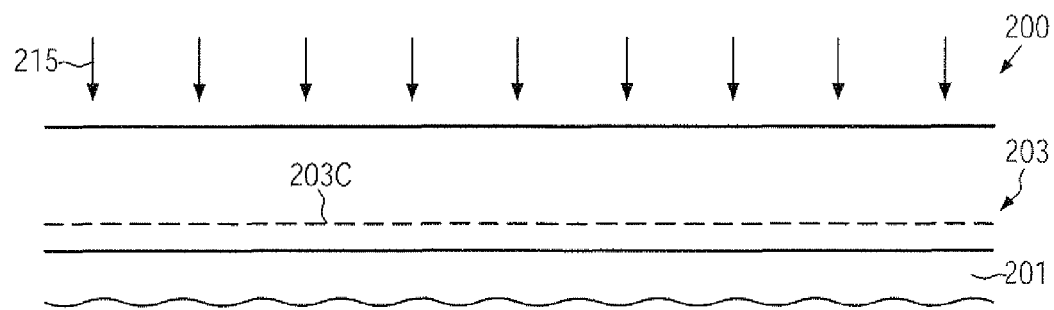

FIG. 2i schematically illustrates the semiconductor device 200 according to still further illustrative embodiments in which the semiconductor region or layer 203 may be formed on the substrate 201 by an epitaxial growth process 215, wherein the etch control species 203C may be incorporated during a certain phase of the growth process 215. For instance, a corresponding N-type dopant species may be supplied in the form of an appropriate precursor gas to the deposition ambient of the process 215 so as to position the species 203C at the specified depth. Thereafter, supply of the N-type dopant precursor gas may be discontinued, thereby providing a well-defined depth and thickness of the corresponding etch control species 203C.

Figure 2J:
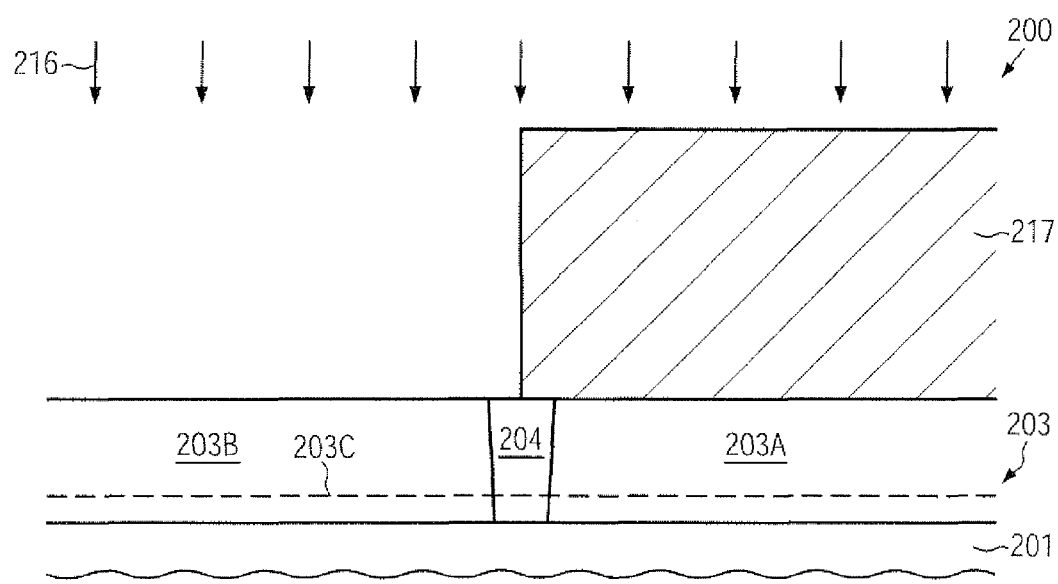

FIG. 2j schematically illustrates the device 200 in a further advanced manufacturing stage in which the layer 203 is provided in its final thickness, wherein the isolation structure 204 separates the active regions 203A, 203B. Furthermore, it may be assumed that the presence of the etch control species 203C may result in a modified electrical behavior in the active region 203B. In this case, an appropriate implantation process 216 performed, for instance, during a sequence for defining the basic dopant concentration in the active region 203B, in which an appropriate degree of counter doping may be introduced at the specified depth in order to "compensate" the etch control species 203C, while a corresponding implantation mask 217 may cover the active region 203A, in which a presence of the etch control species 203C may be desired.

Thereafter, the above-described process sequence for forming the cavities on the basis of a wet chemical etch process may be performed as described above, wherein the etch control species 203C may provide enhanced controllability with respect to a depth and thus size of the resulting cavities.

As a result, the present disclosure provides semiconductor devices and techniques in which enhanced transistor performance may be obtained on the basis of a semiconductor alloy that may be positioned close to the adjacent channel region. For this purpose, a wet chemical etch process may be used which may provide a significantly reduced degree of variability during the corresponding sequence for defining the lateral offset of the cavities and forming the cavities. Moreover, since a pronounced deposition of spacer material may not be required and due to the fact that the wet chemical etch process may be performed with high controllability in a batch process, overall throughput may be significantly increased compared to conventional strategies in which plasma assisted etch recipes may require a single wafer process strategy.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
  forming a dielectric etch stop material on exposed surface areas of a gate electrode structure of a transistor formed above a silicon-containing crystalline semiconductor region, wherein a thickness of said dielectric etch stop layer is approximately 2 nm or less;
  forming cavities in said crystalline semiconductor region adjacent to said gate electrode structure by performing a wet chemical etch process having different removal rates in at least two different crystallographic orientations of said crystalline semiconductor region;
  forming a strain-inducing semiconductor alloy at least in said cavities by performing a selective epitaxial growth process; and
  forming drain and source regions in at least a portion of said strain-inducing semiconductor alloy.

2. The method of claim 1, wherein said wet chemical etch process is performed on the basis of tetra methyl ammonium hydroxide (TMAH).

3. The method of claim 1, wherein forming said dielectric etch stop material comprises forming a silicon dioxide layer at least on sidewall surfaces of said gate electrode structure.

4. The method of claim 1, further comprising positioning an N-type dopant species at a specified depth within said crystalline semiconductor region and using said N-type dopant species to control said wet chemical etch process.

5. The method of claim 4, wherein said N-type dopant species is positioned at said specified depth by performing an ion implantation process.

6. The method of claim 5, wherein said ion implantation process is performed prior to forming said gate electrode structure.

7. The method of claim 5, wherein said ion implantation process is performed after forming said gate electrode structure.

8. The method of claim 4, wherein said crystalline semiconductor region is formed by an epitaxial growth process and said N-type dopant species is positioned at said specified depth during said epitaxial growth process.

9. The method of claim 4, wherein said semiconductor alloy is formed so as to induce a compressive strain in a channel region of said transistor.

10. The method of claim 9, wherein said semiconductor alloy is comprised of silicon and germanium.

11. The method of claim 9, wherein said semiconductor alloy comprises tin.

12. A method, comprising:
  forming an etch stop material at least on sidewalls of a gate electrode material prior to forming said cavities wherein said etch stop material has a thickness of approximately 2 nm or less;
  forming cavities in a crystalline semiconductor region adjacent to a gate electrode structure of a transistor formed above a portion of said crystalline semiconductor region by performing a wet chemical etch process on the basis of tetra methyl ammonium hydroxide (TMAH);
  forming a strain-inducing semiconductor alloy in said cavities; and
  forming drain and source regions in said semiconductor region adjacent to said gate electrode structure.

13. The method of claim 12, wherein forming said cavities further comprises positioning an N-type dopant species at a specified depth in said semiconductor region and using said N-type dopant species to control said wet chemical etch process.

14. The method of claim 12, wherein forming said drain and source regions comprises forming a semiconductor alloy in said cavities, wherein said semiconductor alloy induces a compressive strain in a channel region of said transistor.

15. The method of claim 14, further comprising providing a mask layer above a second transistor while forming said cavities and forming said semiconductor alloy in said cavities.

16. The method of claim 14, wherein said semiconductor alloy comprises at least one of germanium and tin.

* * * * *